US011690186B2

(12) United States Patent
Takatsu et al.

(10) Patent No.: US 11,690,186 B2
(45) Date of Patent: Jun. 27, 2023

(54) PANEL MODULE UNIT

(71) Applicant: MITUTOYO CORPORATION, Kawasaki (JP)

(72) Inventors: Yuhei Takatsu, Kawaguchi (JP); Atsuya Niwano, Setagaya-ku (JP)

(73) Assignee: MITUTOYO CORPORATION, Kawasaki (JP)

( * ) Notice: Subject to any disclaimer, the term of this patent is extended or adjusted under 35 U.S.C. 154(b) by 0 days.

(21) Appl. No.: 17/451,023

(22) Filed: Oct. 15, 2021

(65) Prior Publication Data
US 2022/0124922 A1 Apr. 21, 2022

(30) Foreign Application Priority Data
Oct. 21, 2020 (JP) .................................. 2020-176427

(51) Int. Cl.
H05K 5/02 (2006.01)
H05K 5/00 (2006.01)

(52) U.S. Cl.
CPC ......... *H05K 5/0217* (2013.01); *H05K 5/0017* (2013.01)

(58) Field of Classification Search
CPC .... H05K 5/0217; H05K 5/0017; G01D 13/00; G01D 13/22; G01B 9/00; G01B 3/22
See application file for complete search history.

(56) References Cited

U.S. PATENT DOCUMENTS

| 5,768,798 A * | 6/1998 | Takahashi | G01B 3/22 33/832 |
| 5,979,069 A * | 11/1999 | Hayashida | G01D 5/2415 33/832 |
| 6,121,890 A * | 9/2000 | Tetreault | G01B 3/22 33/561 |
| 6,513,262 B1 * | 2/2003 | Borgognon | G01B 3/22 33/832 |
| 7,490,516 B2 * | 2/2009 | Hedtke | G01D 21/00 73/431 |
| 8,982,056 B2 * | 3/2015 | Rud | G09G 3/20 345/169 |
| 9,971,316 B2 * | 5/2018 | Jia | G05B 13/02 |

(Continued)

FOREIGN PATENT DOCUMENTS

JP 2012-230026 A 11/2012

*Primary Examiner* — Hung S. Bui
*Assistant Examiner* — Sagar Shrestha
(74) *Attorney, Agent, or Firm* — Oblon, McClelland, Maier & Neustadt, L.L.P.

(57) ABSTRACT

There is provided a display panel module unit having a narrow frame suitable for a display unit of a small-sized measuring apparatus. A panel module unit includes a first panel part, a second panel part, and an intermediate cover housed in a housing part in order from a front side to a rear side. The housing part includes an annular side wall and at least one fixing means attached on an inner peripheral surface of the side wall, and the fixing means is a means for fixing a position of the intermediate cover in the housing part. The second panel part is housed between the first panel part and the intermediate cover, and a position of the second panel part is indirectly fixed by the intermediate cover. The second panel part is provided with a biasing means for biasing the first panel part from the rear side toward the front side.

11 Claims, 16 Drawing Sheets

(56) References Cited

U.S. PATENT DOCUMENTS

| | | | |
|---|---|---|---|
| 2009/0153314 A1* | 6/2009 | Young | G01D 11/305 |
| | | | 340/459 |
| 2012/0130547 A1* | 5/2012 | Fadell | F24F 11/63 |
| | | | 700/276 |
| 2012/0272729 A1* | 11/2012 | Arai | G01D 11/24 |
| | | | 73/431 |
| 2013/0094125 A1* | 4/2013 | Schwartz | G01F 15/068 |
| | | | 361/679.01 |
| 2015/0133000 A1* | 5/2015 | Kim | H01R 13/2428 |
| | | | 439/700 |
| 2017/0208945 A1* | 7/2017 | Wengreen | H05K 5/0204 |
| 2018/0031398 A1* | 2/2018 | Niwano | G01B 9/00 |
| 2019/0025876 A1* | 1/2019 | Hiraide | A61B 5/02108 |
| 2019/0223305 A1* | 7/2019 | Hsieh | H05K 5/0017 |

* cited by examiner

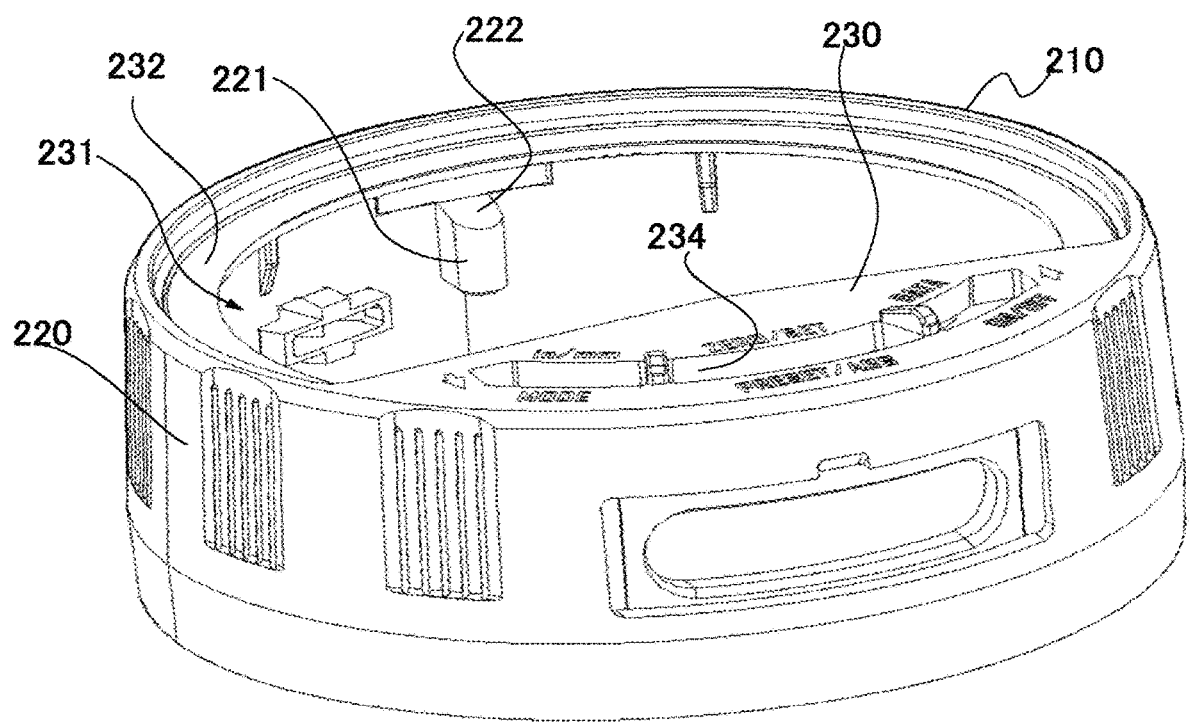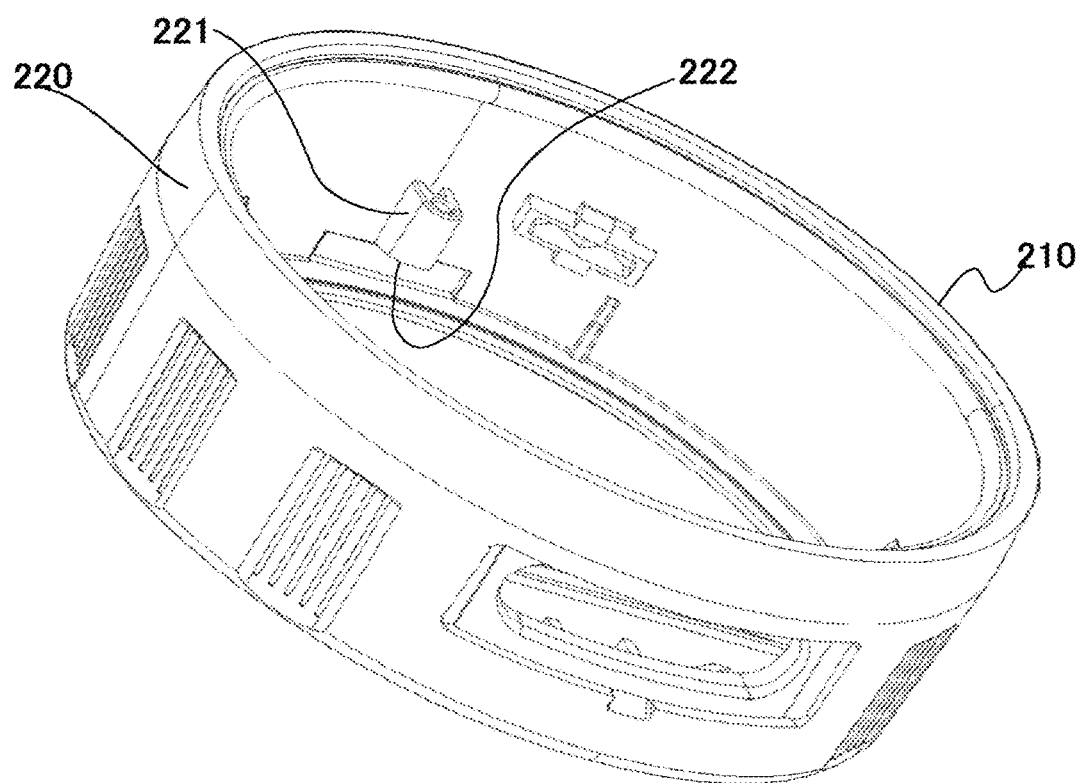
Fig. 6

(THIRD EXEMPLARY EMBODIMENT) Fig. 13

(THIRD EXEMPLARY EMBODIMENT)

Fig. 15 (THIRD EXEMPLARY EMBODIMENT)

(THIRD EXEMPLARY EMBODIMENT)

PANEL MODULE UNIT

INCORPORATION BY REFERENCE

This application is based upon and claims the benefit of priority from JP patent application No. 2020-176427, filed on Oct. 21, 2020 (DAS code 7D60), the disclosure of which is incorporated herein in its entirety by reference.

BACKGROUND OF THE INVENTION

1. Field of the Invention

The present invention relates to a panel module unit and particularly relates to, for example, a display panel module unit to be mounted on a measuring apparatus.

2. Description of Related Art

There have been developed various digitized small-sized measuring apparatuses. (A measuring apparatus can be another word for measuring device, measuring machine, measuring instrument and the like.) A digital small-sized measuring apparatus includes a liquid crystal display panel that digitally displays information such as a measurement value and the like (for example, JP 2012-230026 A).

SUMMARY OF THE INVENTION

In order to hold a display panel in a front side opening of a housing, a space is secured between the outer edge of the display panel and the inner wall of the housing to dispose a necessary fixing means in this space, and the outer edge of the display panel is fixed to the housing. Then, the outer edge of the display panel on the front side is covered by a frame, which is a part of the housing, in order for the fixing means, the wiring, and the like not to be seen from the front.

Naturally, it is desirable to increase the size of the display unit as much as possible in order to improve the visibility and enable touch panel operation. Thus, it is desirable to make the width of the frame as narrow as possible.

However, a small-sized measuring apparatus is assumed to be used in an environment where there is water, oil, or dust, and needs to be protected in order for oil and dust not to enter the space between the display panel and the housing. For this reason, it is necessary to secure a space in which a fixing means for fixing the display panel to the housing as disclosed in, for example, JP 2012-230026 A, and it has been difficult, in designing, to maximize the display unit by narrowing the frame.

A panel module unit according to an exemplary embodiment of the present invention is a panel module unit comprising:

a housing part serving as an outer cover of the panel module unit;
a first panel part;
a second panel part; and
an intermediate cover, wherein
the first panel part, the second panel part, and the intermediate cover are housed in the housing part in order from a front side to a rear side,
the housing part comprises:
an annular side wall;
a front opening provided on the front side in such a manner that the first panel part is seen from the front side;
a frame provided around the front opening; and
at least one fixing means attached on an inner peripheral surface of the side wall of the housing part, the fixing means being a means for fixing a position of the intermediate cover in the housing part,
the second panel part is housed between the first panel part and the intermediate cover,
a position of the second panel part is indirectly fixed by the intermediate cover, and
the second panel part is provided with a biasing means for biasing the first panel part from the rear side toward the front side In an exemplary embodiment of the present invention, it is preferable that the fixing means provided on the inner peripheral surface of the side wall of the housing part is a boss provided at a position separated from the frame of the housing part toward the rear side in such a manner as to protrude from the inner peripheral surface of the side wall toward an inside of the housing part.

In an exemplary embodiment of the present invention, it is preferable that the second panel part has an outer edge provided with a cutout for avoiding interference with the fixing means.

In an exemplary embodiment of the present invention, it is preferable that the biasing means is a flat spring integrally formed on the second panel part.

In an exemplary embodiment of the present invention, it is preferable that the flat spring having a narrow width is formed by forming a slit along an outer edge of the second panel part near the outer edge.

In an exemplary embodiment of the present invention, it is preferable that the biasing means is a flat spring formed on the second panel part as a separated body.

In an exemplary embodiment of the present invention, it is preferable that the flat spring made of metal is attached to the second panel part.

In an exemplary embodiment of the present invention, it is preferable that
the biasing means is the flat spring formed by bending an elastic thin plate material into a substantially U-shape, and
the flat spring is provided on an outer edge of the second panel part in such a manner as to receive the second panel part inside the substantially U-shape.

In an exemplary embodiment of the present invention, it is preferable that
the first panel part is a display panel,
an electronic printed circuit board is disposed between the second panel part and the intermediate cover,
the display panel and the electronic printed circuit board are electrically connected to each other by a connector provided in such a manner as to pass through the second panel part, and
the connector serves as a pressing means for pressing the display panel toward the front side.

In an exemplary embodiment of the present invention, it is preferable that the second panel part is a back light module.

A measuring apparatus according to an exemplary embodiment of the present invention is a measuring apparatus including the panel module unit as a display unit.

BRIEF DESCRIPTION OF THE DRAWINGS

FIG. 6 is a view of a first screw boss when viewed from a front opening;

DETAILED DESCRIPTION

Figure 1:
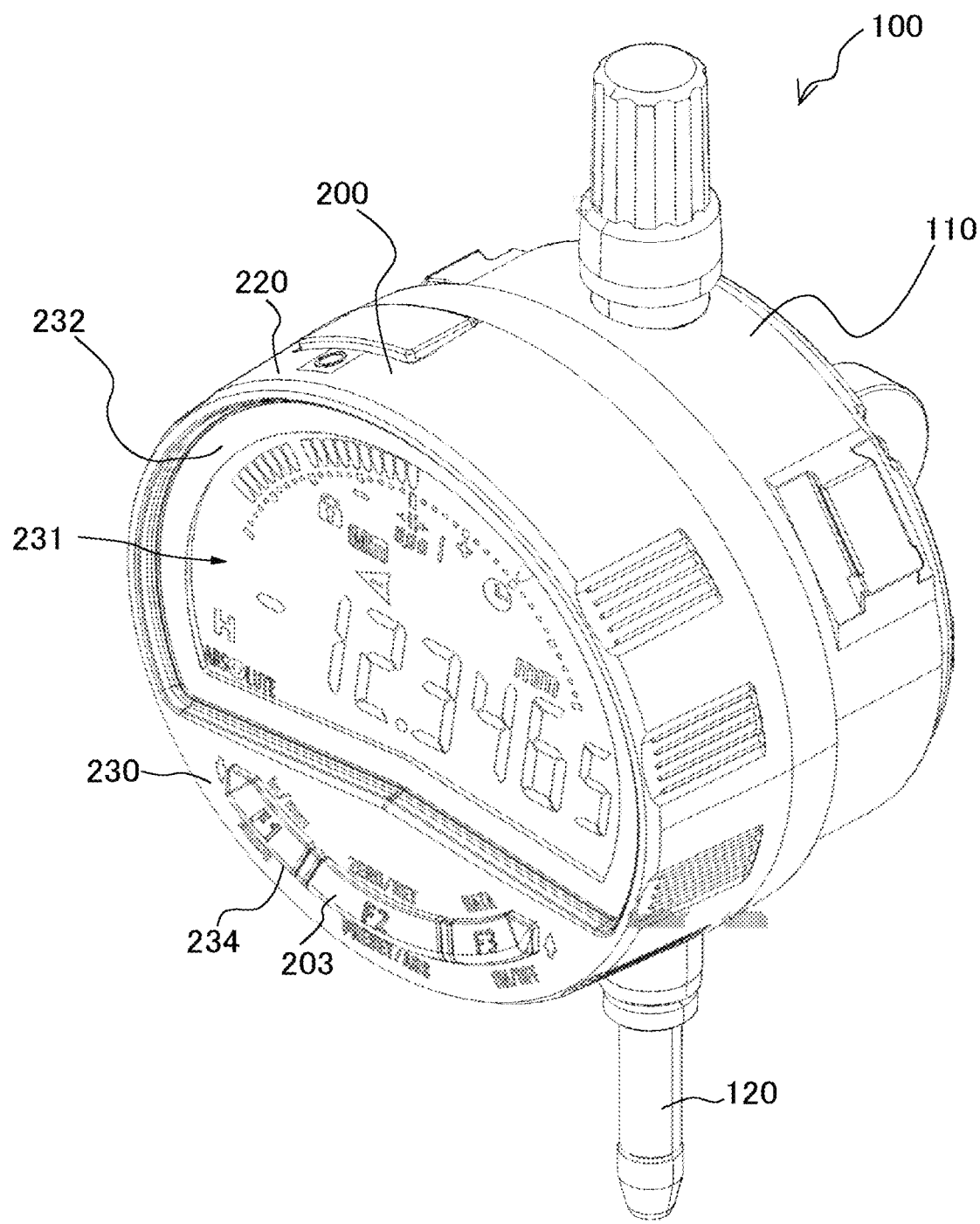
FIG. 1 is an external view of a digital display type dial gauge.

Exemplary embodiments of the present invention are illustrated and described with reference to the reference signs attached to the elements in the drawings.

First Exemplary Embodiment

A first exemplary embodiment of the present invention is described.

The first exemplary embodiment is described by exemplifying a digital display type dial gauge (also referred to as a digital indicator).

FIG. 1 is an external view of a digital display type dial gauge 100.

The dial gauge 100 includes a cylindrical measuring apparatus main body 110, a spindle 120, and a display panel module unit 200.

The spindle 120 moves forward and backward by passing through the measuring apparatus main body 110. The measuring apparatus main body 110 has a displacement detector (not shown), such as an encoder, thereinside. The moving amount (or position) of the spindle 120 is detected by the displacement detector. Then, the measurement value based on the displacement amount (or position) of the spindle 120 is displayed on the display panel module unit 200.

The display panel module unit 200 is attached on the front side of the measuring apparatus main body 110.

Figure 2:
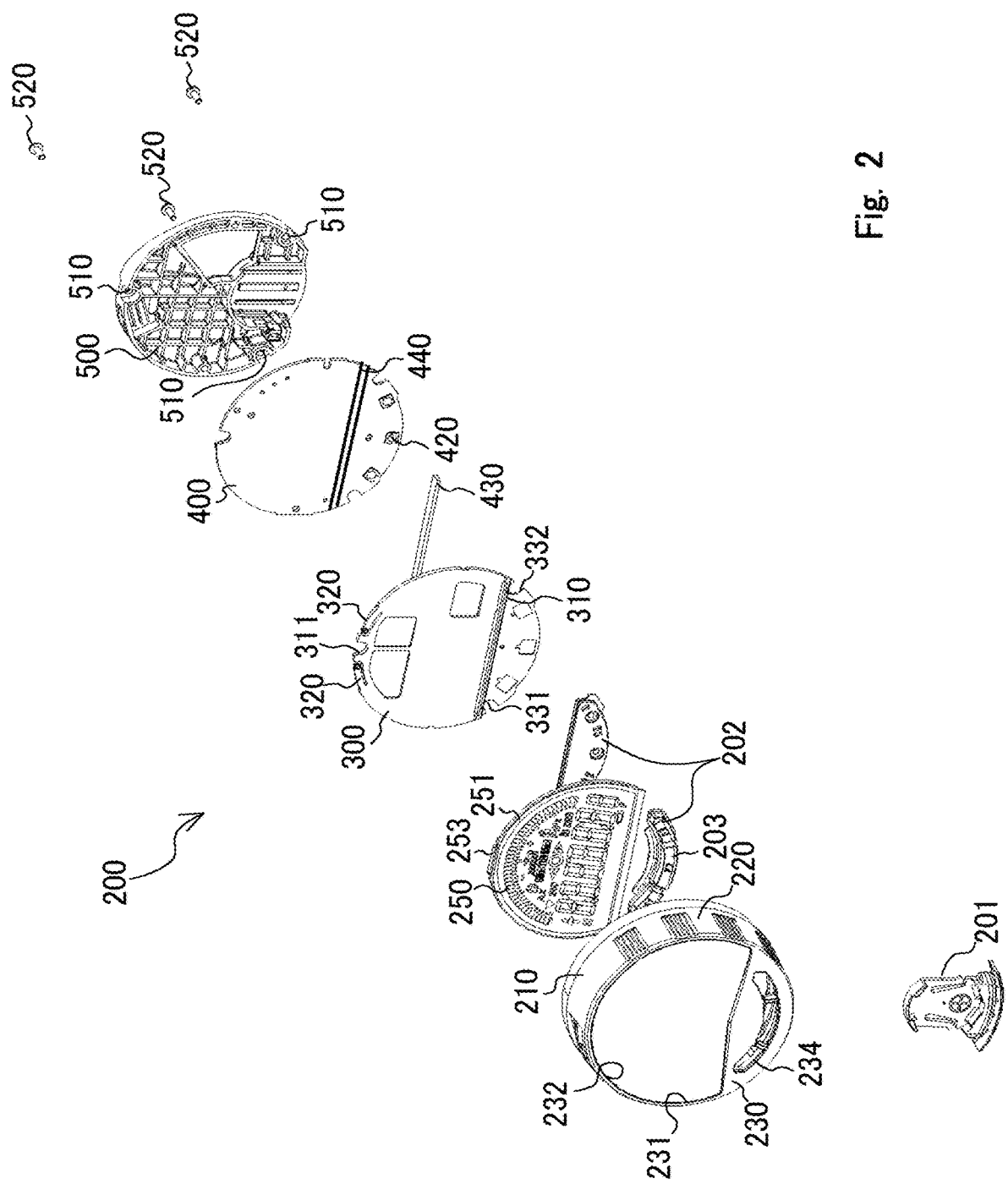
FIG. 2 is an exploded view of a display panel module unit when viewed from a front side.

FIG. 2 is an exploded view of the display panel module unit 200 when viewed from the front side.

Figure 3:
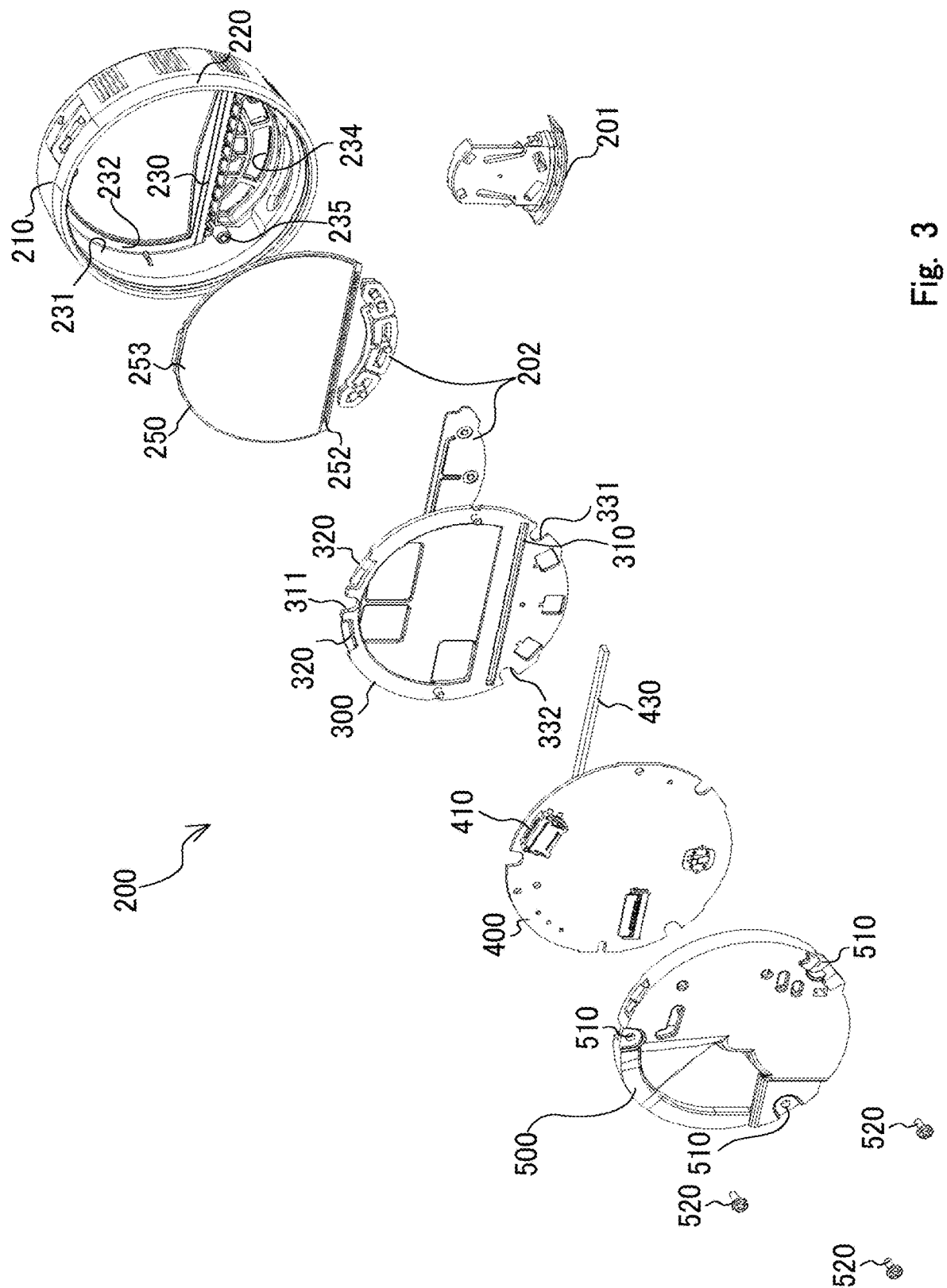
FIG. 3 is an exploded view of the display panel module unit when viewed from a rear side.

FIG. 3 is an exploded view of the display panel module unit 200 viewed from the rear side.

The display panel module unit 200 includes a housing part 210, a display panel (first panel part) 250, an intermediate panel (second panel part) 300, an electronic printed circuit board 400, and an intermediate cover 500.

The display panel (first panel part) 250, the intermediate panel (second panel part) 300, the electronic printed circuit board 400, and the intermediate cover 500 are housed in the housing part 210 in this order.

The housing part 210 has, as a whole, a short cylindrical shape with both ends open. In this specification, the housing part 210 is circular, but may be elliptic, rectangular, or other polygonal.

The housing part 210 includes an annular side wall 220 and a front wall 230.

The annular side wall 220 has a short cylindrical shape with both ends open. The annular side wall 220 is provided with the front wall 230 on its front side. The annular side wall 220 and the front wall 230 may be separated bodies, or the annular side wall 220 and the front wall 230 may be integrally formed as the housing part 210.

The front wall 230 is provided with a front opening 231. That is, the housing part 210 has an opening region larger than the semicircle when viewed from its front side. In other words, the housing part 210 has an opening in the entire upper region above the line slightly below the diameter line extending in the right/left direction, when viewed from the front side. The opening provided in the front wall 230 is referred to as a front opening 231.

Between the front opening 231 and the annular side wall 220, a narrow frame 232 is provided. Specifically, in the upper region of the front wall 230 above the line slightly below the diameter line extending in the right-left direction, the narrow frame 232 is provided between the front opening 231 and the annular side wall 220. In other words, the frame 232 is a residual face of the front wall 230 along the outer edge of the front opening 231.

In addition, in the lower region of the front wall 230 below the front opening 231, three button insertion openings 234 are provided.

Figure 4:
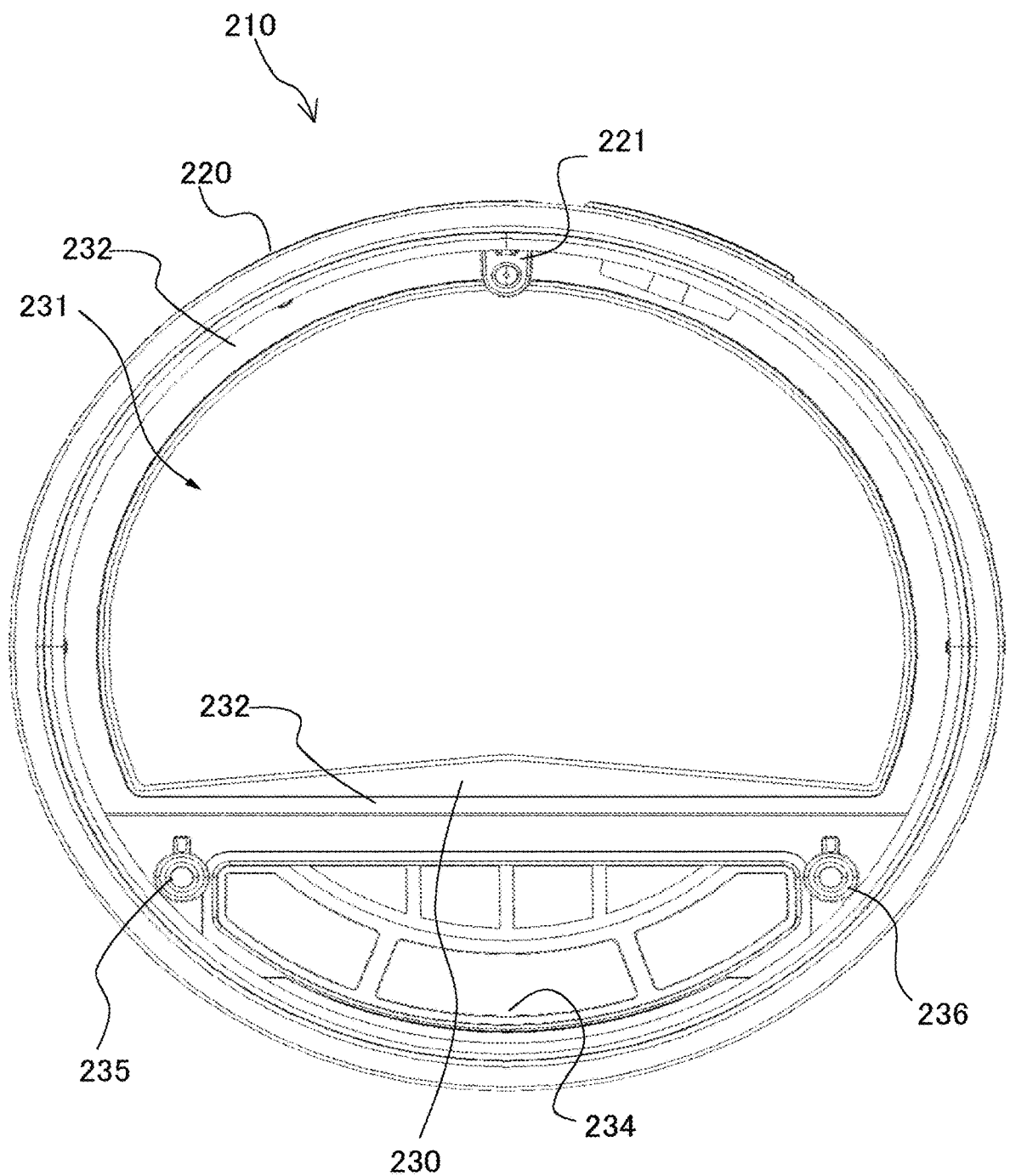
FIG. 4 is a rear view of a housing part.

FIG. 4 is a rear view of the housing part 210.

In FIGS. 3 and 4, when the housing part 210 is viewed from the rear side, the rear face of the frame 232 is shown. The rear face of the frame 232 also serves as a stopper that receives the display panel (the first panel part) 250. The rear face of the frame 232 is finished to be a flat surface in order for its entire face to be in close contact with the outer edge of the display panel 250 without a gap.

Here, the width of the frame 232 may be wide, but it is desired, in view of the point of the present invention, to make the frame 232 as narrow as possible in order to make the displayable region as large as possible. For example, the width of the frame 232 is preferably 10 mm or less, more preferably 5 mm to 8 mm, further preferably narrower, and may be about 3 mm to 5 mm. Although the details will be described later, the frame 232 is only required to serve as a stopper in the present exemplary embodiment, and it is feasible that the width of the frame 232 is about 3 mm to 5 mm. Thus, most of the region of the front wall 230 can be used as a display unit, which enables a small-sized measuring apparatus to perform large screen display.

As shown in the rear view of the housing part 210 in FIG. 4, three screw bosses are provided inside the housing part 210.

In the rear view of the housing part 210, the three screw bosses are provided at intervals of 120° along the inner periphery of the annular side wall 220. In the rear view of the housing part 210 in FIG. 4, the three screw bosses are referred to as a first screw boss 221, a second screw boss 235, and a third screw boss 236 in the counterclockwise order from the top screw boss.

First, the second screw boss 235 and the third screw boss 236 are provided in a standing manner on the rear face of the front wall 230.

Meanwhile, the first screw boss 221 is provided not on the rear face of the front wall 230 but on the inner peripheral surface of the annular side wall 220.

Figure 5:
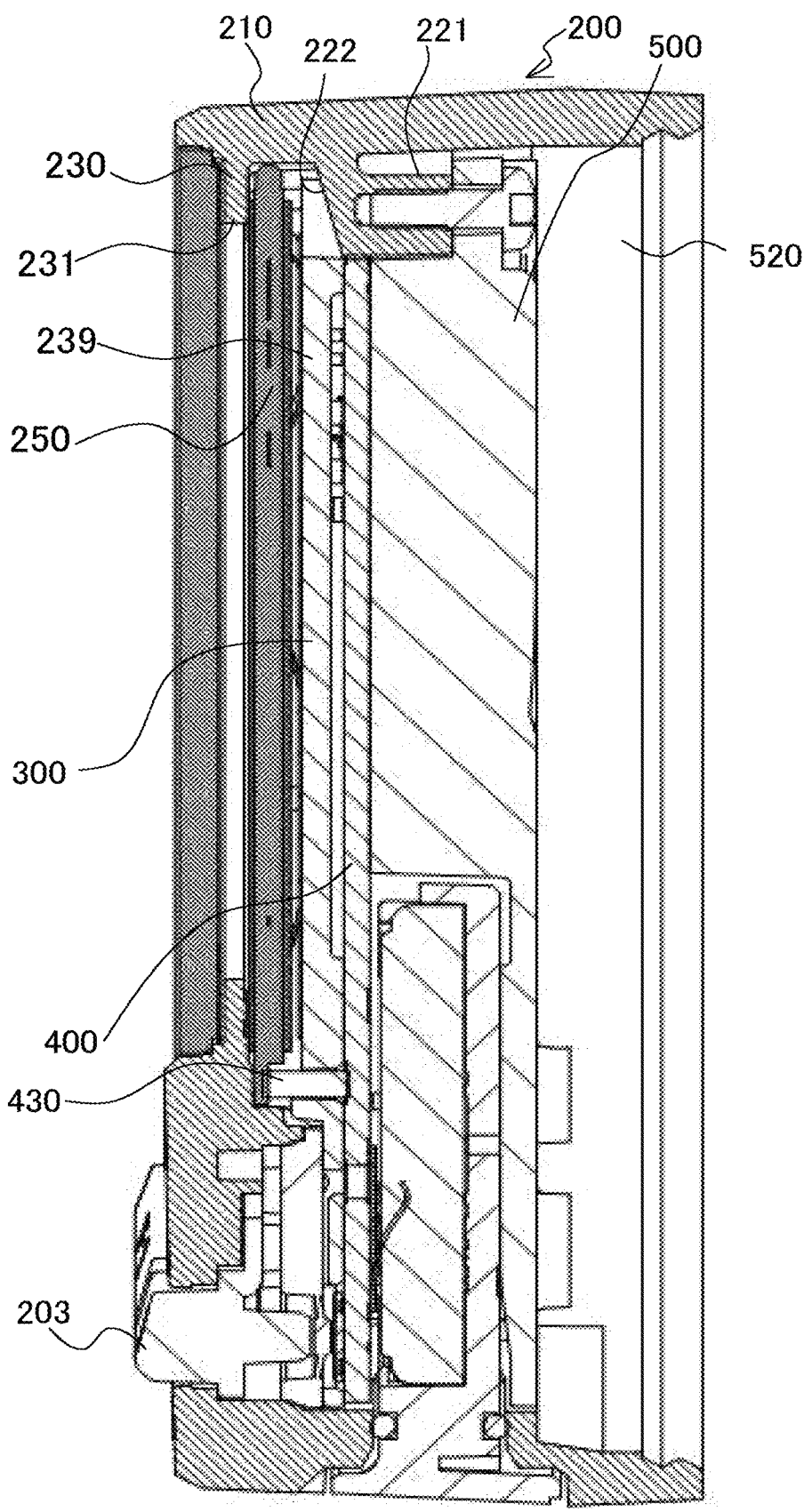
FIG. 5 is a cross-sectional view of the display panel module unit.

FIG. 5 is a cross-sectional view of the display panel module unit 200.

FIG. 6 is a view of the first screw boss 221 viewed from the front opening 231.

As shown in FIGS. 5 and 6, the first screw boss 221 is provided on the inner peripheral surface of the annular side wall 220 at a position separated from the front wall 230 of the housing part 210 toward the rear side in such a manner as to protrude toward the inside of the housing part 210.

The distance between the front wall 230 and the first screw boss 221 (the distance between the rear face of the front wall 230 and the rear side end face of the first screw boss 221) needs to be strictly designed and machined. This distance is determined according to the balance with the thicknesses of the display panel 250, the intermediate panel 300, the electronic printed circuit board 400, and the intermediate cover 500. The distance between the front wall 230 and the first screw boss 221 is designed in such a manner that, when the display panel 250, the intermediate panel 300, the electronic printed circuit board 400, and the intermediate cover 500 are housed inside the housing part 210, the display panel 250, the intermediate panel 300, and the electronic printed circuit board 400 are stored between the rear face of the front wall 230 and the front face of the intermediate cover 500, securing a slight gap. The slight gap is eliminated by a biasing means described later, and the display panel 250, the intermediate panel 300, and the electronic printed circuit board 400 do not play and rattle.

This point will be described later.

The first screw boss 221 has an inclined front side end face 222. Specifically, the front side end face 222 of the first screw boss 221 is inclined toward the rear side as the front side end face 222 is gradually separated from the annular side wall 220. This is intended, in assembling, for the display panel 250 to avoid the first screw boss 221 by slightly inclining the display panel 250 when the display panel 250 is inserted through the rear side opening of the housing part 210.

Next, the display panel 250 is described.

As the display panel 250, a crystal display panel 250 can be employed, for example. The display panel 250 may be an organic EL panel. In this case, although this is not essential, it is preferable to form display elements not on a flexible film but on a substrate made of glass or plastic. The size and shape of the display panel 250 are designed to be suitable for the shape of the front opening 231. Here, the display panel 250 has a shape of a circle from which the region below a line slightly below the diameter line of the circle is cut off. On the front side of the display panel 250, a fringe 251 is provided around the outer edge. The fringe 251 is finished to be a flat surface in order to be in close contact with the rear face of the frame 232.

As shown in FIG. 3, on the rear face of the display panel 250, a terminal row 252 is provided along the lower edge line to be electrically connected with the display elements. In addition, the top of the display panel 250 (the point farthest from the lower edge line) is slightly cut off in a straight line. This is intended for the edge of the display panel 250 to be in contact with the inner periphery of the annular side wall 220 by a line instead of by a point.

Next, the intermediate panel 300 is described.

The intermediate panel 300 has a size and shape suitable for the inside of the annular side wall 220 of the housing part 210, and is a disk-shaped plate. The material of the intermediate panel 300 may be plastic (synthetic resin). If the intermediate panel 300 is made of plastic (synthetic resin), this leads high cost efficiency. Alternatively, the material of the intermediate panel 300 may be metal (pure metal or alloy). If the intermediate panel 300 is made of metal, the intermediate panel 300 is expected to also serve as an electromagnetic shield.

Slightly below the diameter of the circle of the intermediate panel 300, a linear slit 310 is provided. The position of the slit 310 corresponds to the position of the terminal row 252 of the display panel 250. The slit 310 is referred to as a connector slit 310. At the top of the intermediate panel 300 (the point farthest from the connector slit 310 in a radial direction), a cutout (U-shaped notch) is provided. This notch is referred to as a first notch 311.

Providing the first notch 311 is intended, in assembling, for the intermediate panel 300 to slip through the first screw boss 221 without interfering with the first screw boss 221 when the intermediate panel 300 is to be housed inside the housing part 210.

When it is assumed that the top of the intermediate panel 300 is at 0°, a second notch 331 and a third notch 332 are provided at the positions of 120° and 240°, respectively. The second notch 331 and the third notch 332 are provided for the second screw boss 235 and the third screw boss 236 to pass through the intermediate panel 300.

Figure 7:
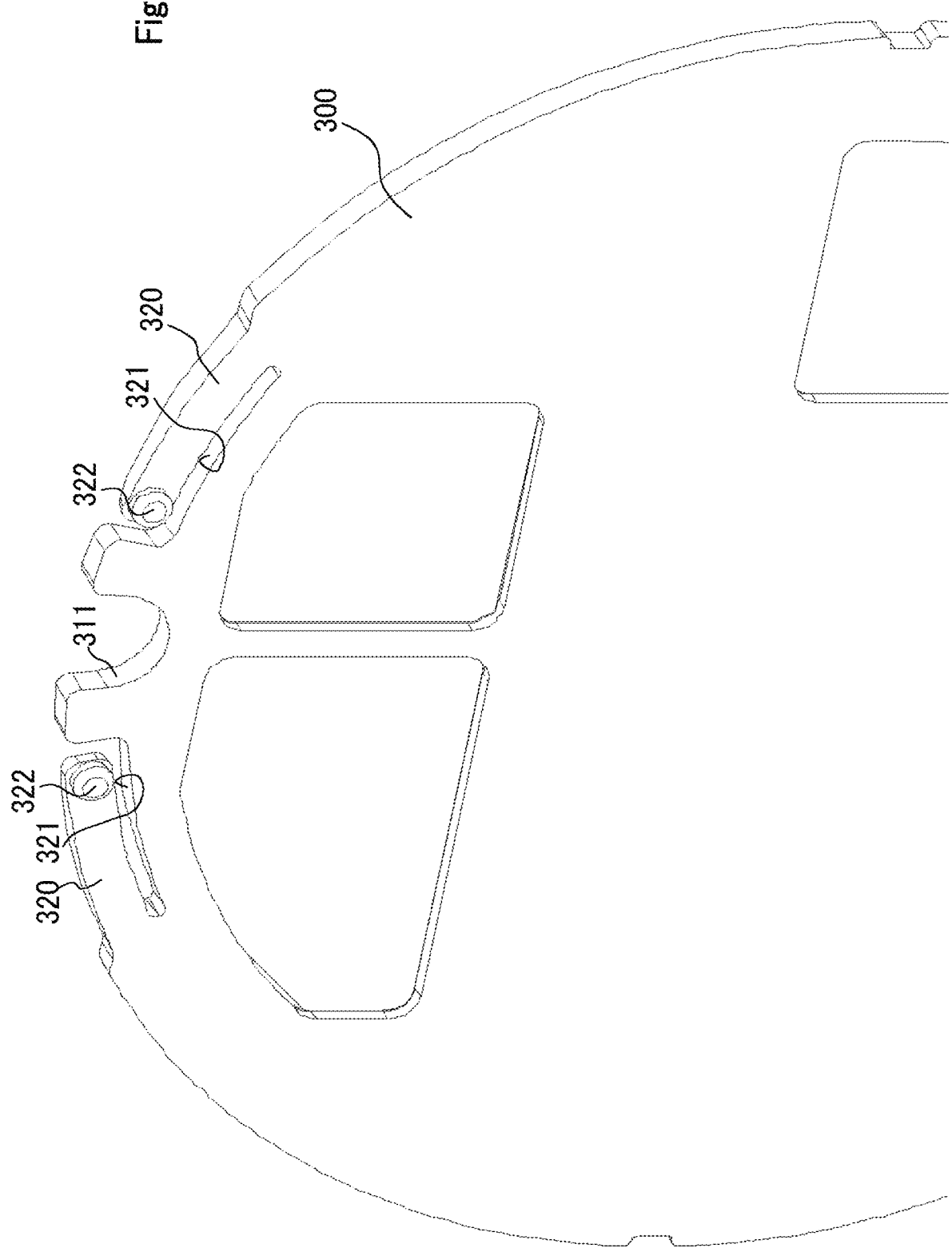
FIG. 7 is an enlarged view of a top of an intermediate panel when viewed from the front side.

FIG. 7 is an enlarged view of the top of the intermediate panel 300 when viewed from the front side.

Figure 8:
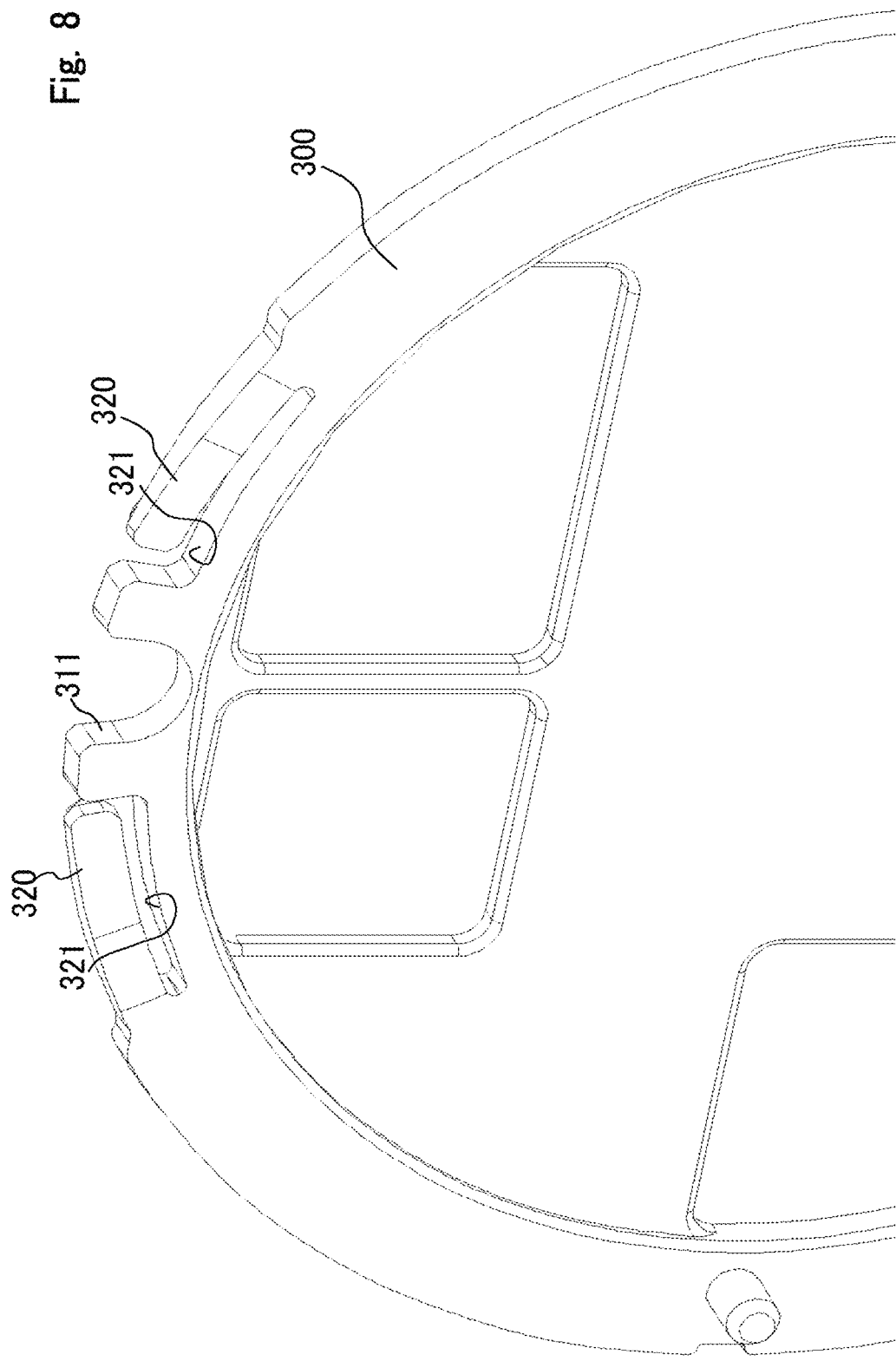
FIG. 8 is an enlarged view of the top of the intermediate panel when viewed from the rear side.

FIG. 8 is an enlarged view of the top of the intermediate panel 300 when viewed from the rear side.

On both sides of the first notch 311, two flat springs (biasing means) 320 are formed. The flat springs 320 are formed integrally with the intermediate panel 300 as narrow width wire rods along the outer edge of the intermediate panel 300. By providing slits 321 each having a substantially L-shape in the outer edge of the intermediate panel 300, narrow width wire rods are obtained. Each wire rod has a tip end separated from the intermediate panel 300 and a base end being continuous with the intermediate panel 300. On the front side of the tip end of each wire rod obtained in this manner, a protrusion 322 is provided. Since the protrusion 322 presses the display panel 250 from the rear face toward the front face, the protrusion 322 is referred to as a pressing protrusion 322. The height of the pressing protrusion 322 is properly designed. That is, the height of the pressing protrusion 322 is designed in such a manner that the biasing force of the flat spring 320 presses the display panel 250 against the rear face of the front wall 230 when the display panel 250, the intermediate panel 300, the electronic printed circuit board 400, and the intermediate cover 500 are housed inside the housing part 210.

Note that, it is desirable, as shown in FIG. 7, that the outer edge of the intermediate panel 300 is slightly recessed in the region corresponding to each flat spring 320 in order to position the pressing protrusion 322 slightly inside the outermost edge of the intermediate panel 300 and to adjust the strength of the flat spring 320. In addition, it is desirable, as shown in FIG. 8, that the region corresponding to each flat spring 320 is slightly recessed to be thinned in the rear face of the intermediate panel 300.

The electronic printed circuit board 400 is an existing electronic printed circuit board and is mounted with a display control circuit, an external output connector 410, button contacts 420, and the like.

Although detailed wiring is omitted in FIG. 2, a line-shaped terminal row 440 is provided on the front side of the electronic printed circuit board 400. Between the terminal row 252 on the rear face of the display panel 250 and the terminal row 440 on the front face of the electronic printed circuit board 400, a connector member 430 is sandwiched. The connector member 430 electrically connects the electronic printed circuit board 400 to the display panel 250. At the positions of the top (0°), 120°, and 240° of the electronic printed circuit board 400, notches are provided.

The intermediate cover 500 has a size and shape suitable for the inside of the annular side wall 220 of the housing part 210, and is a disk-shaped plate.

In order to secure the strength of the display panel module unit 200, a grid-like rib is provided on the front side of the intermediate cover 500. At the positions of the top (0°), 120°, and 240° of the intermediate cover 500, through holes 510 are provided. The three through holes 510 correspond to the first screw boss 221, the second screw boss 235, and the third screw boss 236. In the three through holes 510, setscrews 520 are inserted from the rear side.

As shown in, for example, FIG. 3, shallow holes as counter bores are provided on the rear side of the intermediate cover 500 around the three through holes 510. In addition, as shown in FIG. 2, shallow holes for receiving the first screw boss 221, the second screw boss 235, and the third screw boss 236 are provided on the front side of the intermediate cover 500 around the three through holes 510. Note that, the outer edge side of the intermediate cover 500 is open in each shallow hole.

The other configurations of the display panel module unit 200 are briefly described.

From the lower side face of the housing part 210, a battery cartridge 201 can be inserted. The battery is held between the rear face of the electronic printed circuit board 400 and the front face of the intermediate cover 500. Inside the annular side wall 220, a button unit 202 is disposed below the display panel 250, the button unit 202 is held between the front wall 230 and the intermediate panel 300 while buttons 203 protrude from the button insertion openings 234 of the front wall 230.

To assemble the display panel module unit 200, the display panel 250, the button unit 202, the intermediate panel 300, the connector member 430, the electronic printed circuit board 400, and the intermediate cover 500 are housed in the housing part 210 in this order. The display panel 250 needs to be inserted in the housing part 210 by being inclined to avoid the first screw boss 221, but the intermediate panel 300, the electronic printed circuit board 400, and the intermediate cover 500 do not need to be inclined to be inserted.

Note that, the connector member 430 is inserted into the connector slit 310 of the intermediate panel 300 to connect the terminal row 252 of the display panel 250 to the terminal row 440 of the electronic printed circuit board 400. Then, the setscrews 520 are inserted into the three through holes 510 from the rear face of the intermediate cover 500, and the setscrews 520 are screwed into the first screw boss 221, the second screw boss 235, and the third screw boss 236.

The intermediate cover 500 is fixed by screwing with the first screw boss 221, the second screw boss 235, and the third screw boss 236. Between the front side of the intermediate cover 500 and the rear side of the front wall 230, the display panel 250, the intermediate panel 300, and the electronic printed circuit board 400 are sandwiched. At this time, on the rear side of the top of the display panel 250, the flat springs 320 of the intermediate panel 300 firmly press the display panel 250 against the front wall 230. In addition, on the lower edge side of the display panel 250, the connector member 430 is sandwiched between the electronic printed circuit board 400 and the display panel 250, and the connector member 430 presses the display panel 250 toward the front wall 230. Then, the display panel 250 is held while being in close contact with the rear face of the front wall 230 corresponding to the frame 232.

In the present exemplary embodiment, the first screw boss 221 for fixing the top of the display panel 250 to the housing part 210 is positioned on the rear side of the display panel 250, and the first screw boss 221 does not directly fix the display panel 250 but presses the display panel 250 via the intermediate cover 500, the electronic printed circuit board 400, and the intermediate panel 300 and with the flat springs (biasing means) 320 provided to the intermediate panel 300. In this structure, the frame 232 is only required to serve as a stopper that receives the display panel 250 and to have a width sufficient to function as the stopper. The display panel 250 is firmly pressed by the connector member 430 and the flat springs (biasing means) 740 and in close contact with the rear face of the front wall 230 corresponding to the frame 232 to prevent oil and dust from entering. As a result, the display panel module unit 200 having the narrow frame 232 suitable for the display unit of a small-sized measuring apparatus is achieved.

Second Exemplary Embodiment

Next, a second exemplary embodiment of the present invention is described.

The basic configuration in the second exemplary embodiment is similar to that in the first exemplary embodiment, but a biasing means of an intermediate panel has a feature.

Figure 9:
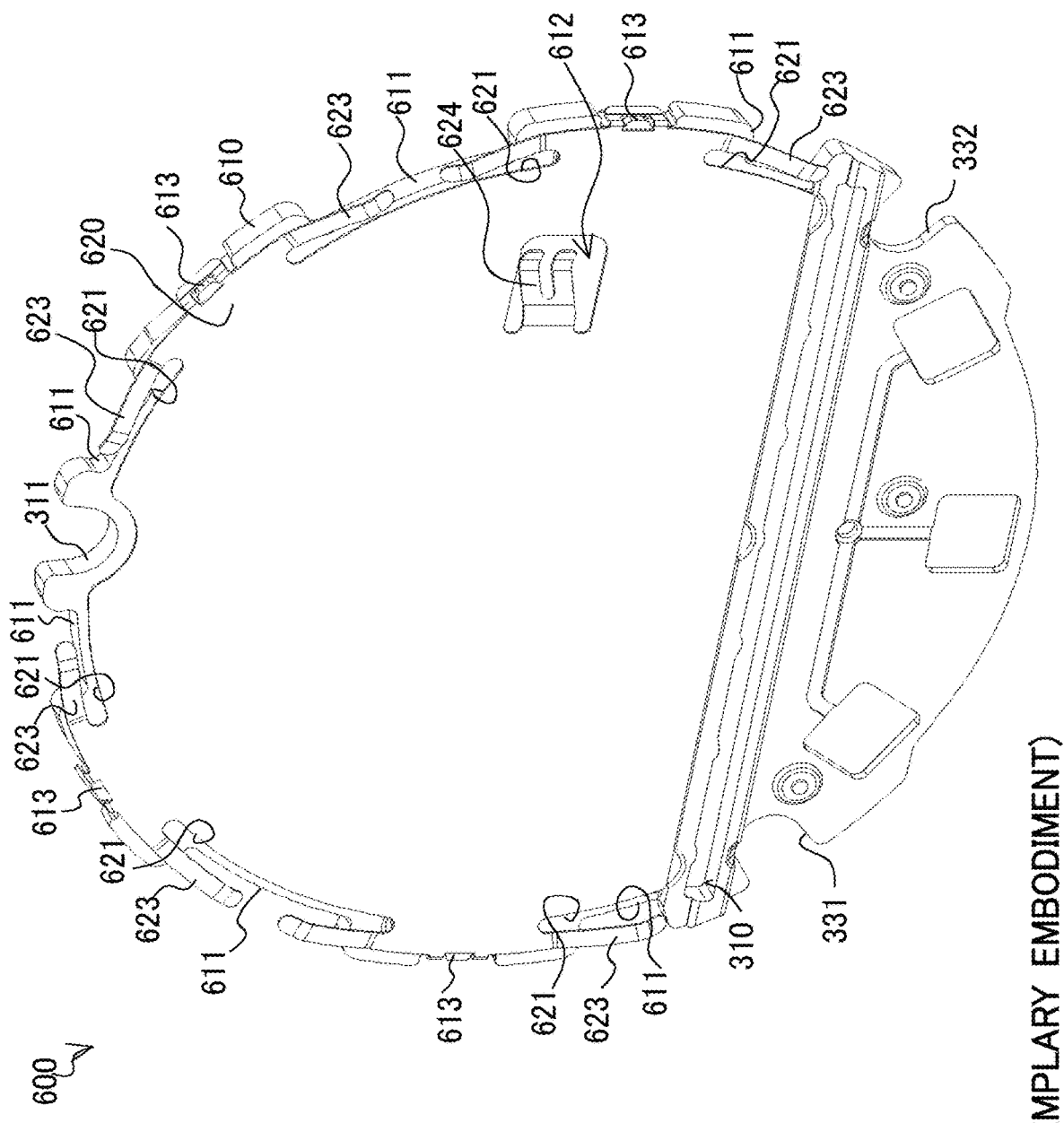
FIG. 9 is a perspective view of an intermediate panel in a second exemplary embodiment when viewed from the front side.

FIG. 9 is a perspective view of an intermediate panel 600 in the second exemplary embodiment when viewed from the front side.

Figure 10:
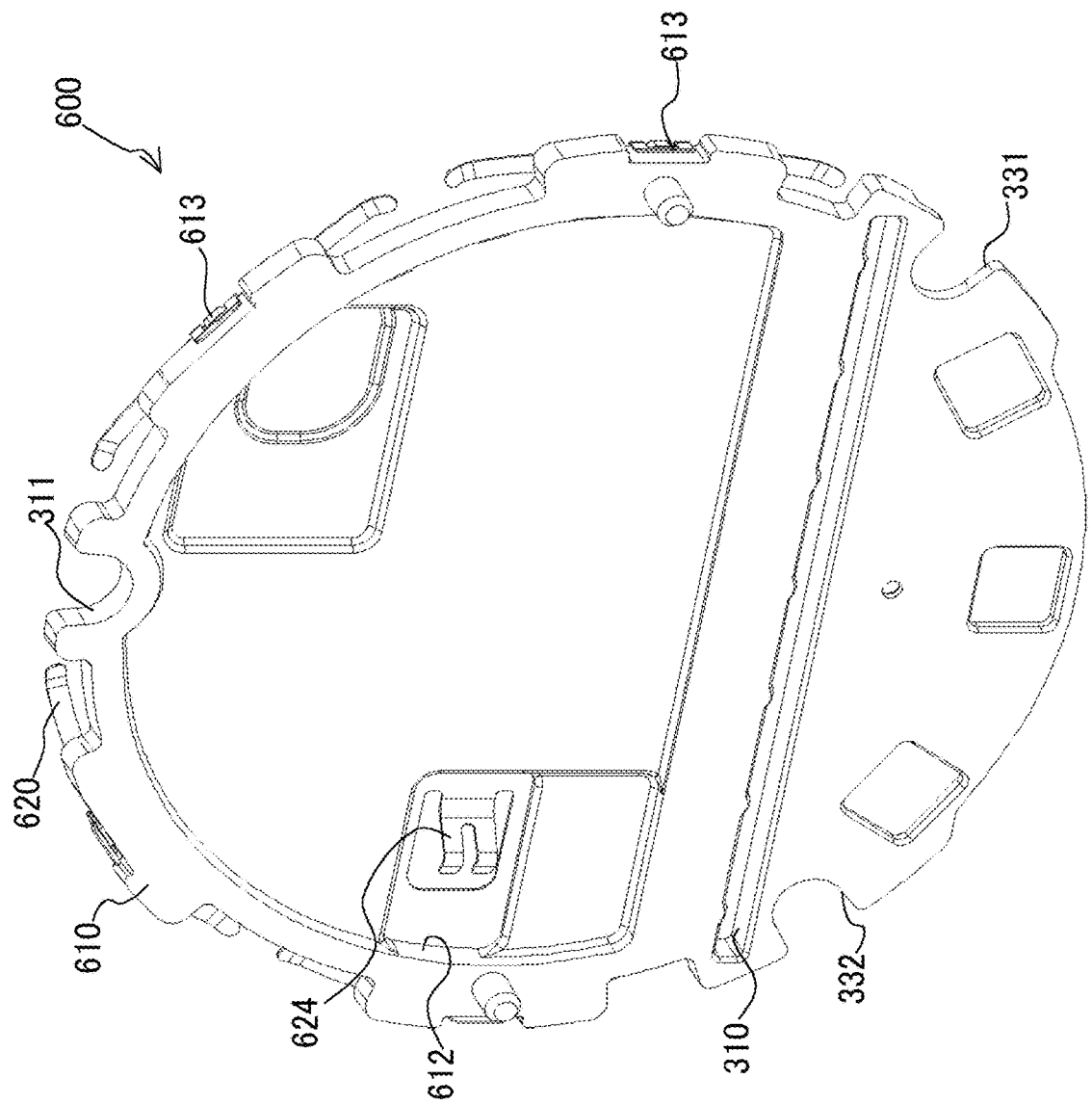
FIG. 10 is a perspective view of the intermediate panel in the second exemplary embodiment when viewed from the rear side.

FIG. 10 is a perspective view of the intermediate panel 600 in the second exemplary embodiment when viewed from the rear side.

The intermediate panel 600 is constituted by combining two plates. That is, the intermediate panel 600 is constituted by a base plate 610 and a spring thin plate 620.

The base plate 610 is substantially equivalent to the intermediate panel 300 in the first exemplary embodiment, but has the following differences.

Above a connector slit 310, recesses 611 each having a predetermined width by slightly cutting out the outer edge in the radial direction are provided to the outer edge of the base plate 610. The positions of the recesses 611 correspond to the positions at which flat springs 623 described later are provided. Here, when it is assumed that the position of a first notch 311 is 0° in FIG. 9, the recesses 611 are provided at the positions of about 10°, 45°, 100°, 260°, 315°, and 350°. (Note that, the recesses 611 at the positions of 45° and 315° each have a width double the width of each of the recesses 611 at the other positions.)

In the intermediate panel 600, a rectangular through hole 612 is provided at the position of 270°.

The spring thin plate 620 is a thin plate made of metal. The spring thin plate 620 has substantially the same size and shape as those of a display panel 250. That is, the spring thin plate 620 has a size and shape substantially overlapping the display panel 250. Here, the spring thin plate 620 has, similar to the display panel 250, a shape of a circle from which the region below a line slightly below the diameter line of the circle is cut off.

In the region upper the lower edge line of the spring thin plate 620, flat springs (biasing means) are provided around the outer edge. The flat springs provided on the outer edge of the spring thin plate 620 are referred to as outer edge flat springs (biasing means) 623.

The outer edge flat springs 623 are provided at the positions of 10°, 45°, 100°, 260°, 315°, and 350° on the outer edge of the spring thin plate 620. By providing slits 621 in the outer edge of the spring thin plate 620, the outer edge flat springs 623 are formed integrally with the spring thin plate 620 as wire rods each having a narrow width along the outer edge of the spring thin plate 620. That is, by providing a short slits in the radial direction and a long slit along the outer edge in the outer edge of the spring thin plate 620, each narrow width wire rod is obtained. The wire rod has a tip end separated from the intermediate panel 600 and a base end being continuous with the intermediate panel 600. In addition, the base end of the wire rod is bent in such a manner that the tip end protrudes toward the front side.

At the position of 270° of the spring thin plate 620, an inner flat spring 624 is provided. By providing a substantially U-shaped slit at the position of 270° of the spring thin plate 620, the inner flat spring 624 is formed integrally with the spring thin plate 620. The base end of the inner flat spring 624 is bent in such a manner that the tip end of the inner flat spring 624 protrudes toward the rear side of the spring thin plate 620.

The spring thin plate 620 is combined on the front side of the base plate 610. At the positions of 45°, 90°, 270°, and 315° of the outer peripheral end face of the base plate 610, protrusions 613 are provided. In addition, at the positions of 45°, 90°, 270°, and 315° of the spring thin plate 620, holes are provided. Then, the outer edge of the spring thin plate 620 is bend toward the rear side, and the protrusions 613 are fitted into the holes in such a manner as to be hooked.

The assembling method is similar to that in the first exemplary embodiment, and duplicate description is omitted.

In the second exemplary embodiment, the biasing means (the outer edge flat springs 623) are disposed on the outer edge of the intermediate panel 600 substantially evenly along the outer periphery. Thus, the outer edge of the display panel 250 is held while being evenly pressed by a connector member 430 and the outer edge flat springs 623 against a front wall 230 serving as a frame 232. As a result, the gap between the display panel 250 and the frame 232 (the front wall 230) is completely eliminated, and a substantially liquid-tight state is achieved.

By constituting the intermediate panel 600 by combining the two bodies of the base plate 610 and the spring thin plate 620, a highly elastic material can be easily employed for the biasing means (the outer edge flat springs 623 and the inner flat spring 624).

Third Exemplary Embodiment

Next, a third exemplary embodiment of the present invention is described.

The basic configuration in the third exemplary embodiment is similar to that in the first exemplary embodiment, but a back light unit (second panel part) 700 instead of the intermediate panel 300 is mounted in the third exemplary embodiment.

Figure 11:
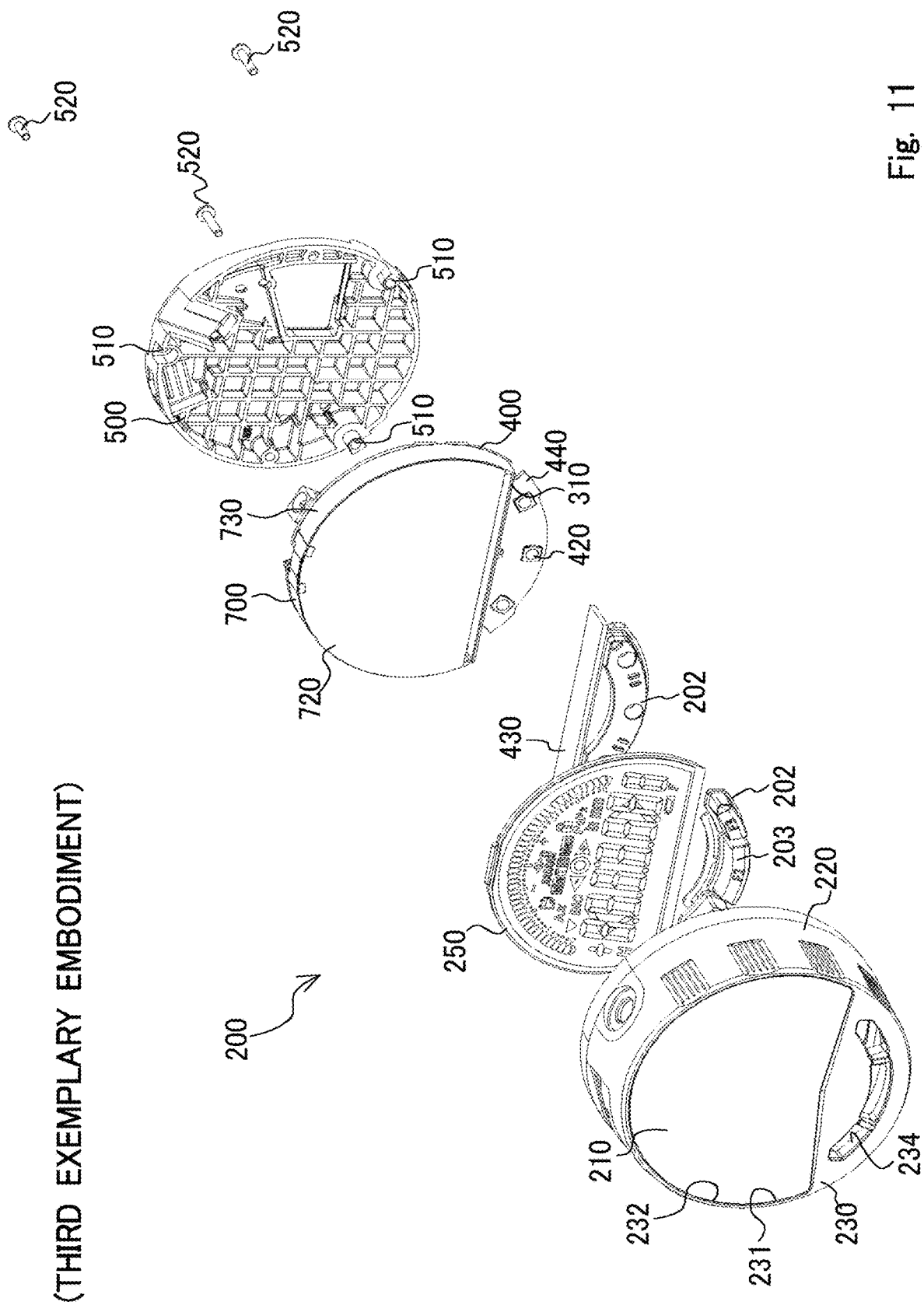
FIG. 11 is an exploded view of a display panel module unit in a third exemplary embodiment when viewed from the front side.

FIG. 11 is an exploded view of a display panel module unit 200 in the third exemplary embodiment when viewed from the front side.

Figure 12:
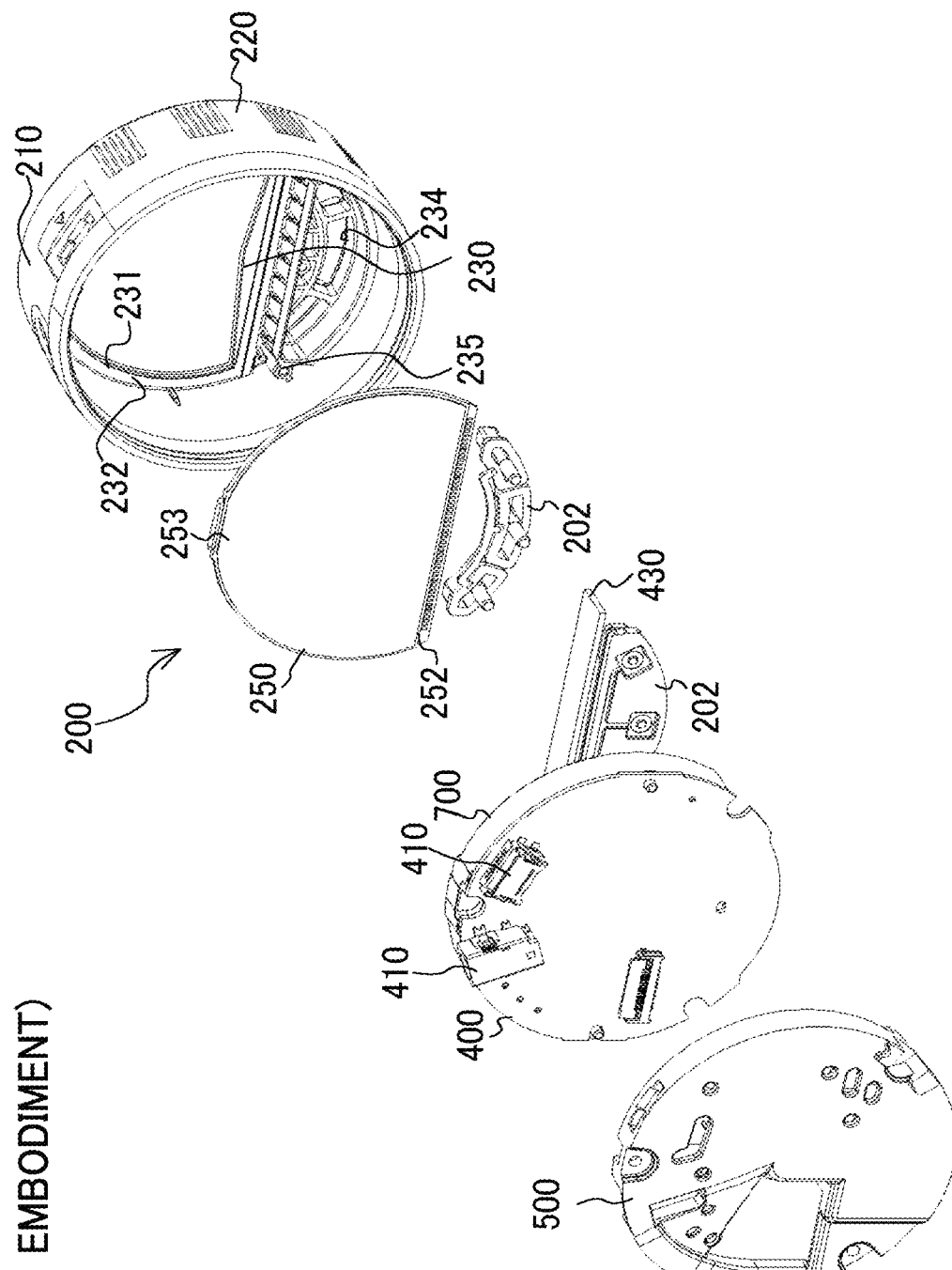
FIG. 12 is an exploded view of the display panel module unit in the third exemplary embodiment when viewed from the rear side.

FIG. 12 is an exploded view of the display panel module unit 200 in the third exemplary embodiment when viewed from the rear side.

Figure 13:
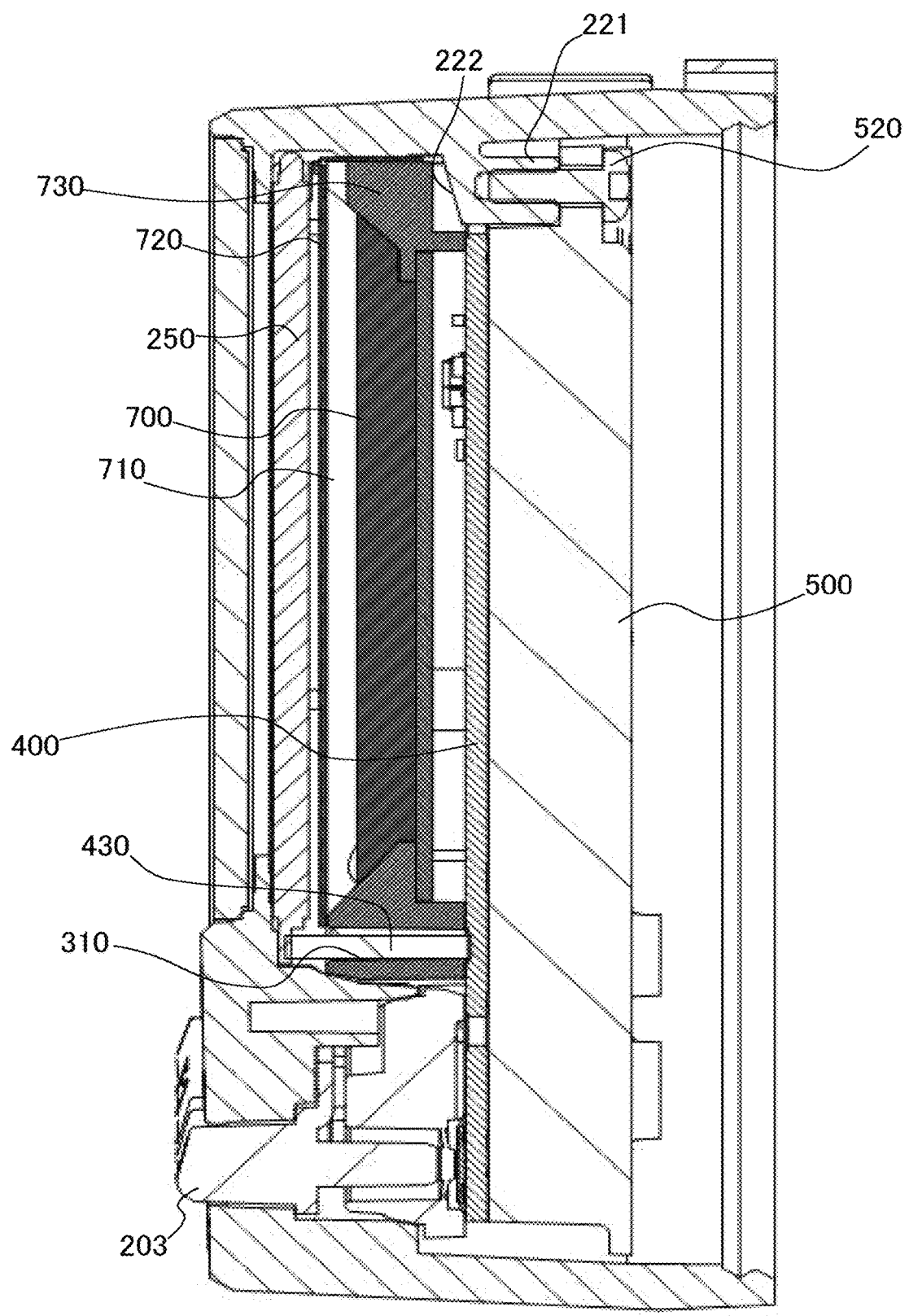
FIG. 13 is a cross-sectional view of the display panel module unit in the third exemplary embodiment.

FIG. 13 is a cross-sectional view of the display panel module unit 200 in the third exemplary embodiment.

Figure 14:
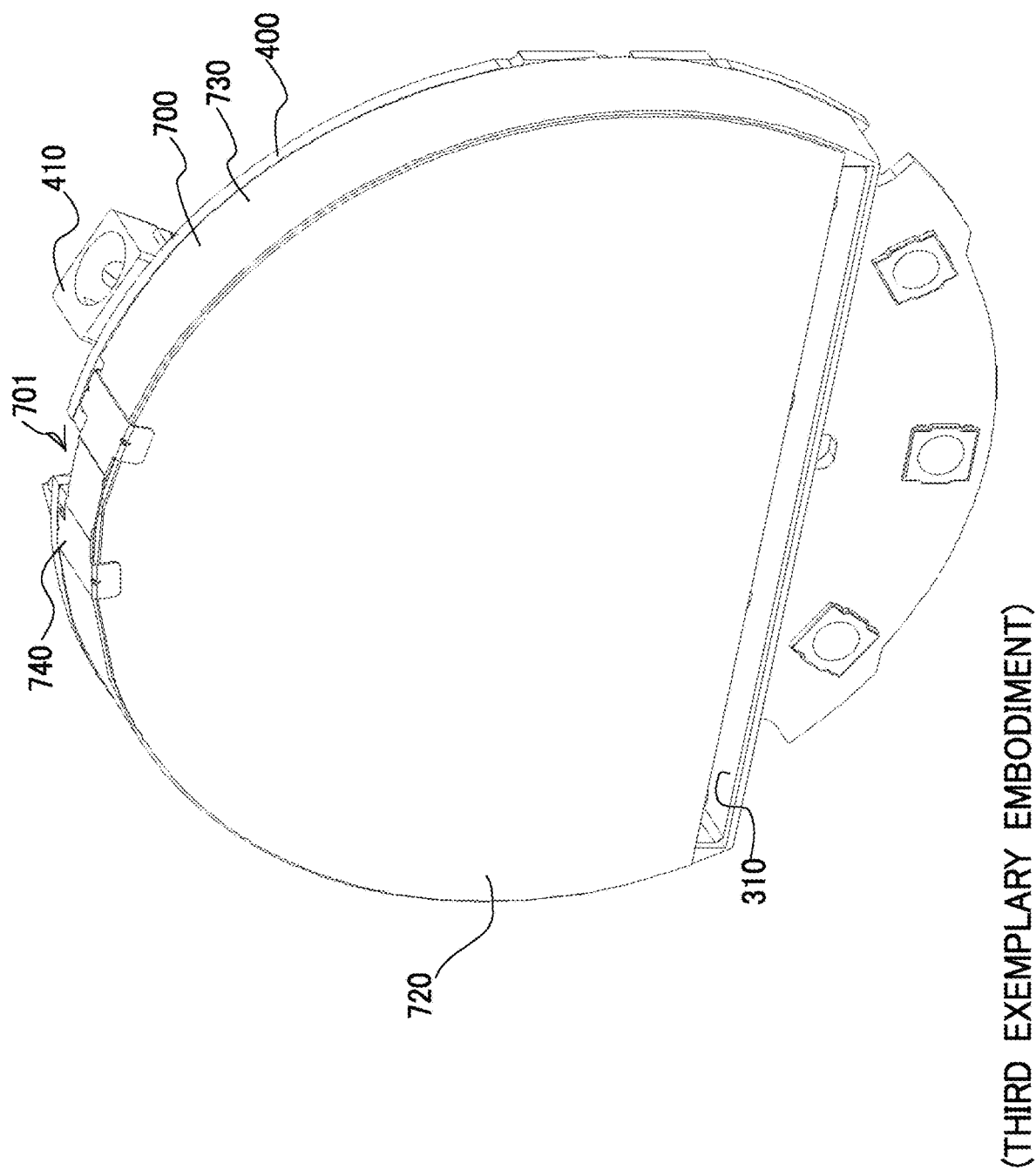
FIG. 14 is a perspective view of a back light unit when viewed from the front side.

FIG. 14 is a perspective view of the back light unit 700 when viewed from the front side.

Figure 15:
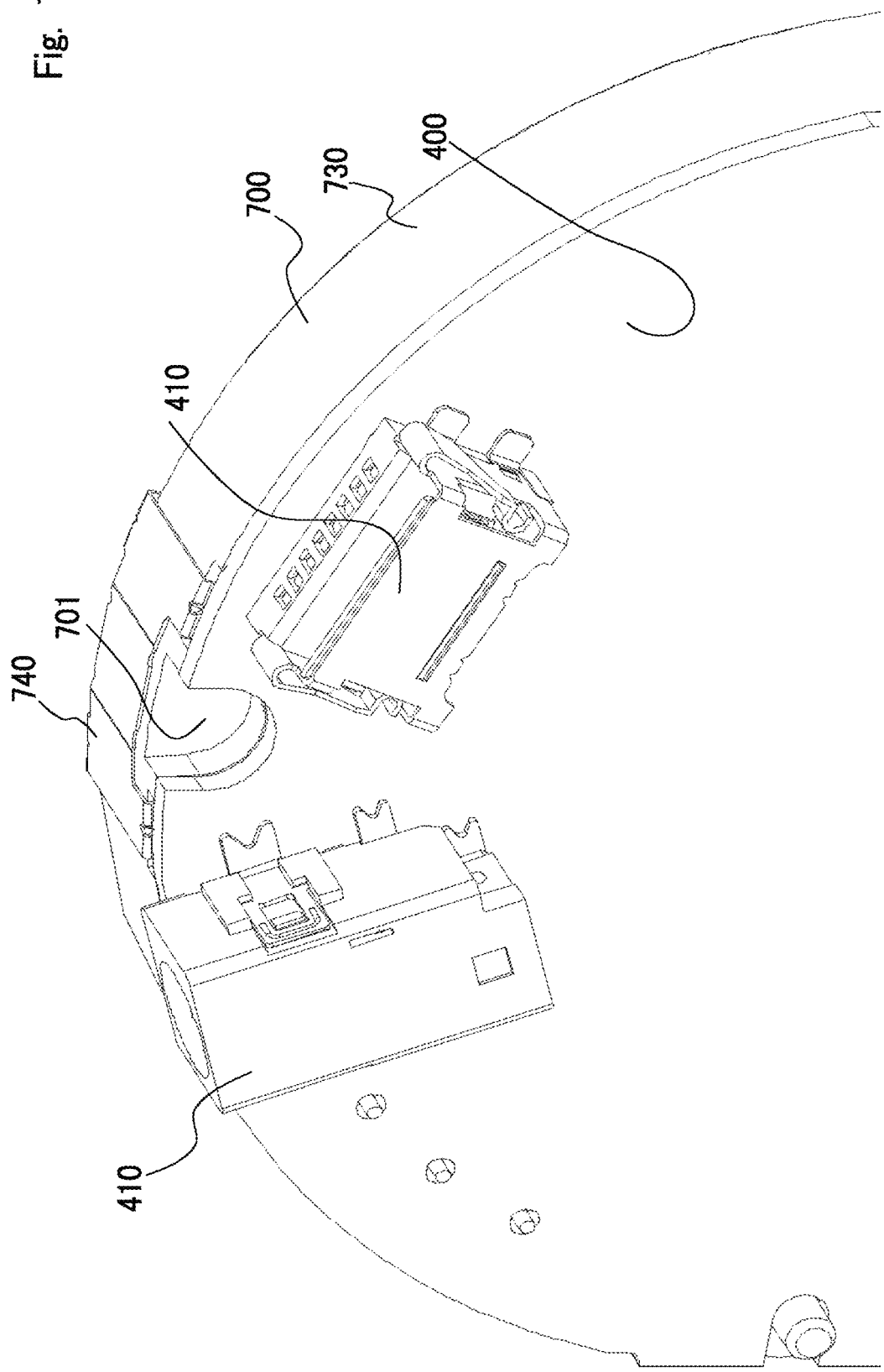
FIG. 15 is an enlarged view of the back light unit when viewed from the rear side.

FIG. 15 is an enlarged view of the back light unit 700 when viewed from the rear side.

In FIGS. 11 and 12, the back light unit 700 is combined on the front side of an electronic printed circuit board 400.

As shown in the cross-sectional view in FIG. 13, the back light unit 700 includes a light source (not shown), a light-guiding plate 710, a light diffusion film 720, and a back light case 730.

The light-guiding plate 710 is fitted on the front side of the back light case 730, and the light diffusion film 720 is bonded on the front side of the light-guiding plate 710. The back light unit 700 has a shape suitable for the shape of a display panel 250, and has a shape of a circle from which the region below a line slightly below the diameter line of the circle is cut off when viewed from the front. Note that, near the lower edge of the back light case 730, a connector slit 310 through which a connector member 430 is inserted is provided.

Note that, similarly to the first and second exemplary embodiments, notches are provided at the positions of the top (0°), 120°, and 240° of the electronic printed circuit board 400.

Meanwhile, a shallow recess 701 is provided at the position equivalent to the top (0°) of the back light unit 700 when viewed from the rear side as shown in FIG. 15. In the recess 701, the outer edge side of the back light unit 700 (the back light case 730) is open. The recess 701 is for avoiding the interference between the back light unit 700 and a first screw boss 221 when the back light unit 700 is to be housed in a housing part 210.

Note that, a notch instead of the recess 701 may be provided at the top (0°) of the back light unit 700. In this case, since the back light unit 700 slips through the first screw boss 221 in assembling, and there is no need to insert the back light unit 700 by being inclined. However, if the top (0°) of the back light unit 700 is completely cut out, the cut-out region has no back light, and a certain position (top (0°)) of the display panel 250 becomes slightly dark.

As a biasing means, a flat spring 740 is provided at the top (0°) of the back light unit 700.

The flat spring 740 has a substantially U-shape as a whole, and is formed by bending an elastic thin plate material (metal thin plate). The flat spring 740 is provided on the outer edge of the back light unit 700 by receiving the back light unit 700 inside the substantially U-shape.

Figure 16:
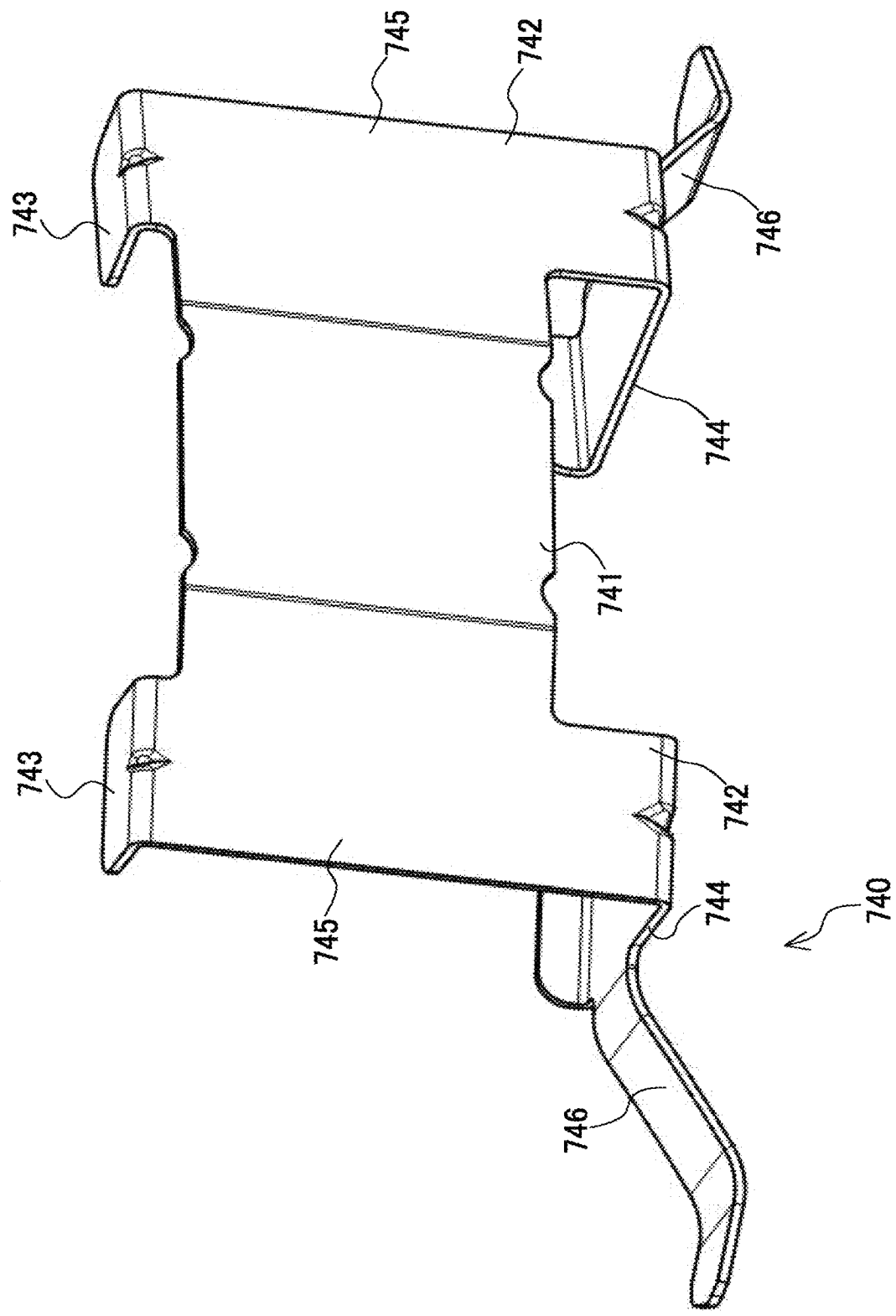
FIG. 16 is a diagram showing a flat spring.

FIG. 16 is a view of the flat spring 740.

Specifically, the flat spring 740 is formed by bending a single piece of metal, and has a shape in which left and right U-shaped spring portions 742 are connected by a center coupling plate portion 741 having a flat plate shape. At the coupling positions between the coupling plate portion 741 and the U-shaped spring portions 742, the left and right U-shaped spring portions 742 are slightly bent in the same direction along the circular shape of the outer edge of the back light unit 700.

Each U-shaped spring portion 742 includes a front plate portion 743, a rear plate portion 744, and an intermediate plate portion 745. The front plate portion 743 is a thin plate member on the front side. The rear plate portion 744 is a thin plate member on the rear side. The intermediate plate portion 745 connects the front plate portion 743 and the rear plate portion 744.

The front plate portion 743 has a flat surface to press the rear face of the display panel 250. The rear plate portion 744 is a spring that presses the electronic printed circuit board 400 toward the rear side to obtain the reaction force, and the tip end side of an Arm 746 extending laterally from the rear plate portion 744 is bent toward the rear side. The length of the intermediate plate portion 745 is designed to be slightly longer than the thickness of the back light unit 700.

The assembling method is similar to that in the first exemplary embodiment, and duplicate description is omitted.

According to the third exemplary embodiment, the back light type display panel module unit 200 can obtain an effect similar to that in the first exemplary embodiment. That is, the display panel 250 is firmly pressed by the connector member 430 and the flat spring (biasing means) 740 against the rear face of a front wall 230 corresponding to a frame 232. Accordingly, the display panel module unit 200 having the narrow frame 232 suitable for the display unit of a small-sized measuring apparatus is obtained.

Note that, the present invention is not limited to the above exemplary embodiments and can be appropriately modified without departing from the scope.

In the above exemplary embodiments, the display panel module unit 200 including the display panel 250 as a first panel part is exemplified, but the first panel part of the panel module unit, may be for example, a solar panel. Alternatively, the first panel part may be any one of or any combination of a touch panel, the display panel 250, and a solar panel.

In the first and second exemplary embodiments, the way to provide the slits in the above exemplary embodiments to form the flat springs 320 or 623 of the intermediate panel (second panel part) 300 or 600 is merely an example.

To form the flat springs 320 or 623 along the corresponding intermediate panel 300 or 600, the slits 321 or 621 are provided along the circumferential direction as exemplified in the above exemplary embodiments (the first and second exemplary embodiments). As a modification, slits may be provided, for example, in the radial direction of the intermediate panel 300 or 600 to form flat springs (wire rods) along the radial direction.

The panel module unit when viewed from the front may not be circular and may be rectangular or other polygonal.

In the above exemplary embodiments, the front wall 230 of the housing part 210 has a relatively large residual region in which the buttons 203 are disposed, but almost the entire face of the front wall 230 may be the front opening 231, and the entire outer periphery of the front wall 230 may be the narrow frame 232 alone. In this case, the second screw boss 235 and the third screw boss 236 are provided, similarly to the first screw boss 221, on the inner peripheral surface of the annular side wall 220 of the housing part 210.

In addition, the flat springs of the intermediate panel are desirable to be evenly disposed on the upper and lower regions, the left and right regions, or the entire outer periphery.

Naturally, a measuring apparatus is not limited to the dial gauge 100 and may be a digital caliper or a digital micrometer.

In addition, the panel module unit (display panel module unit) according to the present invention is not limited to the application to a small-sized measuring apparatus (small tool), and may be employed as a display unit attached to the main body of a medium-sized measuring apparatus (for example, a height gauge) or a large-sized measuring apparatus (for example, a coordinate measuring machine).

REFERENCE SIGNS

100 Dial gauge,
110 Measuring apparatus main body,
120 Spindle,
200 Display panel module unit (panel module unit),
201 Battery cartridge,
202 Button unit,
203 Button,
210 Housing part,
220 Annular side wall,
221 First screw boss,
222 Front side end face of the First screw boss,
230 Front wall,
231 Front opening,
232 Frame,
234 Button insertion opening,
235 Second screw boss,
236 Third screw boss,
250 Display panel (first panel part),
251 Fringe,
252 Terminal row,
300 Intermediate panel (second panel part),
310 Connector slit,
311 First notch,
320 Flat spring (biasing means),
321 Slit,
322 Pressing protrusion,
331 Second notch,
332 Third notch,
400 Electronic printed circuit board,
410 External output connector,
420 Button contact,
430 Connector member,
440 Terminal row,
500 Intermediate cover,
510 Through hole,
520 Setscrew,
600 Intermediate panel,
610 Base plate,
611 Recess,
612 Through hole,
613 Protrusion,
620 Spring thin plate,
621 Slit,
623 Outer edge flat spring (biasing means),
624 Inner flat spring,
700 Back light unit (second panel part),
701 Recess,
710 Light-guiding plate,
720 Light diffusion film,
730 Back light case,
740 Flat spring (biasing means),
741 Coupling plate portion,
742 U-shaped spring portion,
743 Front plate portion,
744 Rear plate portion,
745 Intermediate plate portion,
746 Arm.

The invention claimed is:
1. A panel module unit comprising
a housing part serving as an outer cover of the panel module unit;

a first panel part;
a second panel part; and
an intermediate cover, wherein
the first panel part, the second panel part, and the intermediate cover are housed in the housing part in order from a front side to a rear side,
the housing part comprises:
an annular side wall;
a front opening provided on the front side in such a manner that the first panel part is seen from the front side;
a frame provided around the front opening; and
at least one fixing means attached on an inner peripheral surface of the side wall of the housing part and not a front wall of the housing part, the fixing means being a means for fixing a position of the intermediate cover in the housing part,
the second panel part is housed between the first panel part and the intermediate cover,
a position of the second panel part is indirectly fixed by the intermediate cover, and
the second panel part is provided with a biasing means for biasing the first panel part from the rear side toward the front side.

2. The panel module unit according to claim 1, wherein the fixing means provided on the inner peripheral surface of the side wall of the housing part is a boss provided at a position separated from the frame of the housing part toward the rear side in such a manner as to protrude from the inner peripheral surface of the side wall toward an inside of the housing part.

3. The panel module unit according to claim 1, wherein the second panel part has an outer edge provided with a cutout for avoiding interference with the fixing means.

4. The panel module unit according to claim 1, wherein the biasing means is a flat spring integrally formed on the second panel part.

5. The panel module unit according to claim 4, wherein the flat spring having a narrow width is formed by forming a slit along an outer edge of the second panel part near the outer edge.

6. The panel module unit according to claim 1, wherein the biasing means is a flat spring formed on the second panel part as a separated body.

7. The panel module unit according to claim 6, wherein the flat spring made of metal is attached to the second panel part.

8. The panel module unit according to claim 6, wherein
the biasing means is the flat spring formed by bending an elastic thin plate material into a substantially U-shape, and
the flat spring is provided on an outer edge of the second panel part in such a manner as to receive the second panel part inside the substantially U-shape.

9. The panel module unit according to claim 1, wherein
the first panel part is a display panel,
an electronic printed circuit board is disposed between the second panel part and the intermediate cover,
the display panel and the electronic printed circuit board are electrically connected to each other by a connector provided in such a manner as to pass through the second panel part, and
the connector serves as a pressing means for pressing the display panel toward the front side.

10. The panel module unit according to claim 9, wherein the second panel part is a back light module.

11. A measuring apparatus comprising the panel module unit according to claim 1 as a display unit.

* * * * *